(12) United States Patent
Usui

(10) Patent No.: US 7,187,060 B2
(45) Date of Patent: Mar. 6, 2007

(54) SEMICONDUCTOR DEVICE WITH SHIELD

(75) Inventor: Ryosuke Usui, Ichinomiya (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/784,268

(22) Filed: Feb. 24, 2004

(65) Prior Publication Data

US 2004/0178500 A1 Sep. 16, 2004

(30) Foreign Application Priority Data

Mar. 13, 2003 (JP) .............................. 2003-068145

(51) Int. Cl.
H01L 23/552 (2006.01)
(52) U.S. Cl. ..................................... 257/659; 257/660
(58) Field of Classification Search ................ 257/659, 257/660, 678, 699
See application file for complete search history.

(56) References Cited

U.S. PATENT DOCUMENTS

| 4,929,137 A | 5/1990 | Bossenmaier |
| 5,142,919 A * | 9/1992 | Satoh et al. ............ 73/862.333 |
| 6,686,649 B1 * | 2/2004 | Mathews et al. ........... 257/659 |

FOREIGN PATENT DOCUMENTS

| JP | 63-155697 | 6/1988 |
| JP | 02-017662 A | 1/1990 |
| JP | 5-47962 | 2/1993 |
| JP | 06-275741 | 9/1994 |
| JP | 11-131283 | 5/1999 |
| JP | 11-131283 A | 5/1999 |
| JP | 11-163583 | 6/1999 |
| JP | 11-163583 A | 6/1999 |
| JP | 2001-168231 A | 6/2001 |
| JP | P2002-94247 A | 3/2002 |
| JP | P2002-110717 A | 4/2002 |
| JP | 2002-280468 | 9/2002 |
| JP | 2002-368428 | 12/2002 |
| JP | 2003-046255 | 2/2003 |
| JP | 2004-056155 | 2/2004 |

OTHER PUBLICATIONS

Office Action for corresponding Japanese Patent Application 2004-064828 (which claims priority of JP2003-068145).

* cited by examiner

Primary Examiner—Hoai Pham
(74) Attorney, Agent, or Firm—McDermott Will & Emery LLP

(57) ABSTRACT

The semiconductor device comprises: an interlayer insulating film 405 and an insulating film 409, interconnect lines 407, 408a and 408b embedded in the insulating film 409, circuit elements 410a and 410b mounted on the insulating film 409, a packaging film 415 formed so as to cover the circuit elements 410a and 410b, and an electroconductive shielding film 416 formed so as to cover the packaging film 415. The interconnect lines 408a and 408b are configured to be electrically coupled to the shielding film 416.

3 Claims, 8 Drawing Sheets

SEMICONDUCTOR DEVICE WITH SHIELD

This application is based on Japanese patent application NO.2003-68145, the content of which is incorporated hereinto by reference.

BACKGROUND OF THE INVENTION

1. Field of the Invention

The present invention relates to a semiconductor device, which has a circuit element mounted thereon, and a method for manufacturing same.

2. Description of the Related Art

In recent years, portable electronics products such as cellular phone, PDA (personal digital assistant), DVC (digital video camera), DSC (digital still camera) or the like acquire advanced functions in an accelerating speed. Consequently, advanced functions and/or advanced properties are also required for LSI (large-scale integrated circuit) that is employed for these electronics products. Thus, higher frequency for the operating clock of the LSI is correspondingly required. Further, in such condition, the miniaturization and the weight reduction are essential for these products to be accepted by the market, and thus LSI having higher integration level are required to satisfy these needs.

Thus, the distances between the semiconductor chips are decreased to achieve higher density thereof in order to mounting the high frequency-LSI in a miniaturized manner, and this leads to a problem of being increasingly affected by noises. Conventionally, a technique for addressing the noise problem by covering a package of a semiconductor device with a metal packaging material is disclosed (for example, disclosed in JP-A-H05-47,962).

In the above described technique of covering the package of the semiconductor device with a metal packaging material disclosed in JP-A-H05-47,962, the packaging material is mounted on the printed board as an independent component separated from the semiconductor device, and thus the size of the package after forming the packaging material increases, thereby causing a problem of prohibiting the miniaturization of the package. In addition, since the packaging material is formed as an independent component separated from the semiconductor device, another problem of reducing the productivity thereof is caused.

SUMMARY OF THE INVENTION

In view of the above situation, the present invention provides a solution to the above-mentioned problems, and it is an object of the present invention to provide a technology for addressing the noise problem of the semiconductor device in a simple manner.

In the meantime, a technology referred to as "chip size packaging" or "chip scale packaging" (CSP) is known as a technology of packaging a high frequency-LSI in a miniaturized manner (for example, disclosed in JP-A-2002-94,247). JP-A-2002-94,247 discloses a system-in package having a high frequency-LSI on board. A multi-layer interconnect line structure is formed on a base substrate in this package, and circuit elements such as high frequency-LSI or the like are formed thereon. The multi-layer interconnect line structure comprises a structure, in which a core substrate, a copper foil with a resin or the like form a laminate structure.

However, it is still difficult to achieve the levels of the miniaturization, the reduction of the thickness and the reduction of the weight of the package that are currently desired in the market of the portable electronics products or the like, by employing the conventional CSP. This is because the conventional CSP employs a substrate for supporting the chips. The existence of the support substrate increases the thickness of the entire package, and thus the miniaturization and the reduction of the thickness and the weight of the package are limited. Further, this also provides a certain limitation to the improvement on the heat dissipation ability thereof.

In view of these situations, the applicant of the Japanese application related to the present invention has developed a novel package called ISB™ (Integrated System in Board™). The ISB™ is a unique coreless system-in package, which is a package for electronics circuits mainly having semiconductor bare chips or the like that includes no core (base) for supporting circuit parts while including a patterned copper interconnect line. An example of such system-in package is described in JP-A-2002-110,717.

FIG. 1 is a schematic diagram showing an example of a structure of the ISB™. Although this diagram exemplarily shows a single interconnect line layer for the benefit of understanding the whole structure of the ISB™, the actual ISB™ comprises a laminate structure of a plurality of interconnect line layers. This ISB™ comprises a structure, comprising a LSI bare chip 201, a Tr bare chip 202 and a chip CR 203, that are coupled each other via an interconnect line of a patterned copper 205. The LSI bare chip 201 is electrically coupled to the feedthrough electrodes and the interconnect lines via gold line bonding 204. An electroconductive paste 206 is disposed just under the LSI bare chip 201, through which ISB™ is mounted on the printed board. The whole ISB™ is sealed with a resin package 207 made of a resin such as epoxy resins.

This type of package provides the following benefits:

(i) the package achieves the miniaturization and the lower profile of the transistors, IC and LSI, because the mounting of elements can be achieved in the coreless configuration;

(ii) higher level of system-in package (SiP) can be provided, because an electronic circuit including wide variety of elements such as transistors, system LSI, and additionally chip-type condensers and resisters can be combined to form a circuit and can pack them in one package;

(iii) time required for developing the system LSI can be reduced, because the existing semiconductor chips can be combined to be employed;

(iv) better heat dissipation ability is obtainable, because no core material is disposed under the semiconductor bare chips;

(v) circuit interconnect lines having lower relative dielectric constant can be obtained because the circuit interconnect lines are made of copper material and have no core, so that improved characteristics in the high-speed data transfer and high-frequency circuit are provided;

(vi) the generation of particle contaminations from the electrode materials can be prevented, because electrode is embedded within the package in this structure;

(vii) environmental load can be reduced, because the package size can be small and the amount of the waste materials per one package is about 1/10 of the expected waste generated from the typical 64-pin SQFP(small quad flat-leaded package);

(viii) new concept of the system structure can be achieved, in place of former printed circuit board for mounting parts, to provide new circuit board comprising additional functions; and (ix) engineers of the product manufacturer can design the pattern of the ISB™ without particular assistance, because the design of the pattern of the ISB™ is simple, just like as the design of the pattern of the printed circuit board is simple.

According to the present invention, there is provided a semiconductor device comprising: an insulating layer; an interconnect line embedded in the insulating layer; a circuit element mounted on the insulating layer; a packaging layer formed to cover the circuit element; and an electroconductive shielding film formed to cover the packaging layer, wherein the interconnect line is electrically coupled to the shielding film. Here, the shielding film functions as shielding electromagnetic wave. This configuration can provide the reduction of the influence of the noise. The interconnect line electrically coupled to the shielding film may be grounded. This provides the shielding film being grounded, thereby shielding electromagnetic wave.

The shielding film may be composed of the material same as that employed for composing the interconnect line. The shielding film may include, for example, copper as a main component. In addition, the interconnect line may have a configuration, in which the interconnect line is also electrically coupled to the circuit element. When the semiconductor device is composed of ISB™, some of the interconnect lines that are coupled to the circuit element are grounded. The semiconductor device according to the present invention may have a configuration, in which the shielding film is electrically coupled to the interconnect lines that are grounded in such manner.

The semiconductor device according to the present invention may further comprise a protective film formed to cover the shielding film, the protective film comprising a material having higher corrosion resistance than that of a material that is included in the shielding film. The protective film may include, for example, nickel, gold or the like.

Having these configurations, the semiconductor device can be shielded by the shielding film, while the surface of the shielding film can be protected by the protective film having higher corrosion resistance, and therefore the function of the shielding film can be maintained for longer period.

According to the present invention, there is provided a method for manufacturing a semiconductor device having a circuit element by dividing a multi-layer member, the multi-layer member comprising an insulating layer; an interconnect line embedded in the insulating layer; the circuit element mounted on a surface of the insulating layer, the circuit element being electrically coupled to the interconnect line; and a packaging layer formed to cover the circuit element. The method for manufacturing the semiconductor device comprises: forming a dividing gutter on a surface of the above-mentioned multi-layer member to create an exposed side surface of the interconnect line; covering the front surface of the multi-layer member with an electroconductive material to form a shielding film, the shielding film being electrically coupled to the interconnect line; and cutting the multi-layer member off from the backside thereof along the dividing gutter to separate the circuit element of the multi-layer member from the rest regions thereof.

Having this configuration, it is possible to carry out the step of forming the shielding film in combination with carrying out the step of separating the circuit element from other regions, and thus the countermeasure for the noise problem can be achieved with a simple way. This provides an improvement in the productivity of the semiconductor device.

The method for manufacturing the semiconductor device according to the present invention may further comprises: grounding the interconnect line. The interconnect line may be configured to be electrically coupled to the circuit element.

The method for manufacturing the semiconductor device according to the present invention may have a configuration, in which a plurality of the circuit elements are mounted on the insulating layer, and the interconnect line is provided to be coupled to the plurality of the circuit elements before forming the dividing gutter, and the dividing gutter includes dividing the interconnect line so that each of the divided interconnect lines is coupled to each of the circuit elements, respectively.

The method for manufacturing the semiconductor device according to the present invention may have a configuration, in which copper is included in the electroconductive material as a main component.

The method for manufacturing the semiconductor device according to the present invention may have a configuration, in which the shielding film is formed via a plating method. Also, the shielding film may be formed by applying an electroconductive paste thereon by using a screen printing method.

The method for manufacturing the semiconductor device according to the present invention may further comprises: covering the shielding film with a protective film, the protective film comprising a material having higher corrosion resistance than that of a material which is included in the shielding film.

DESCRIPTION OF THE PREFERRED EMBODIMENTS

FIGS. 2A to 2E are cross sectional views of a semiconductor device according to the preferred embodiment of the present invention, showing the process steps for manufacturing the semiconductor device.

Figure 1:
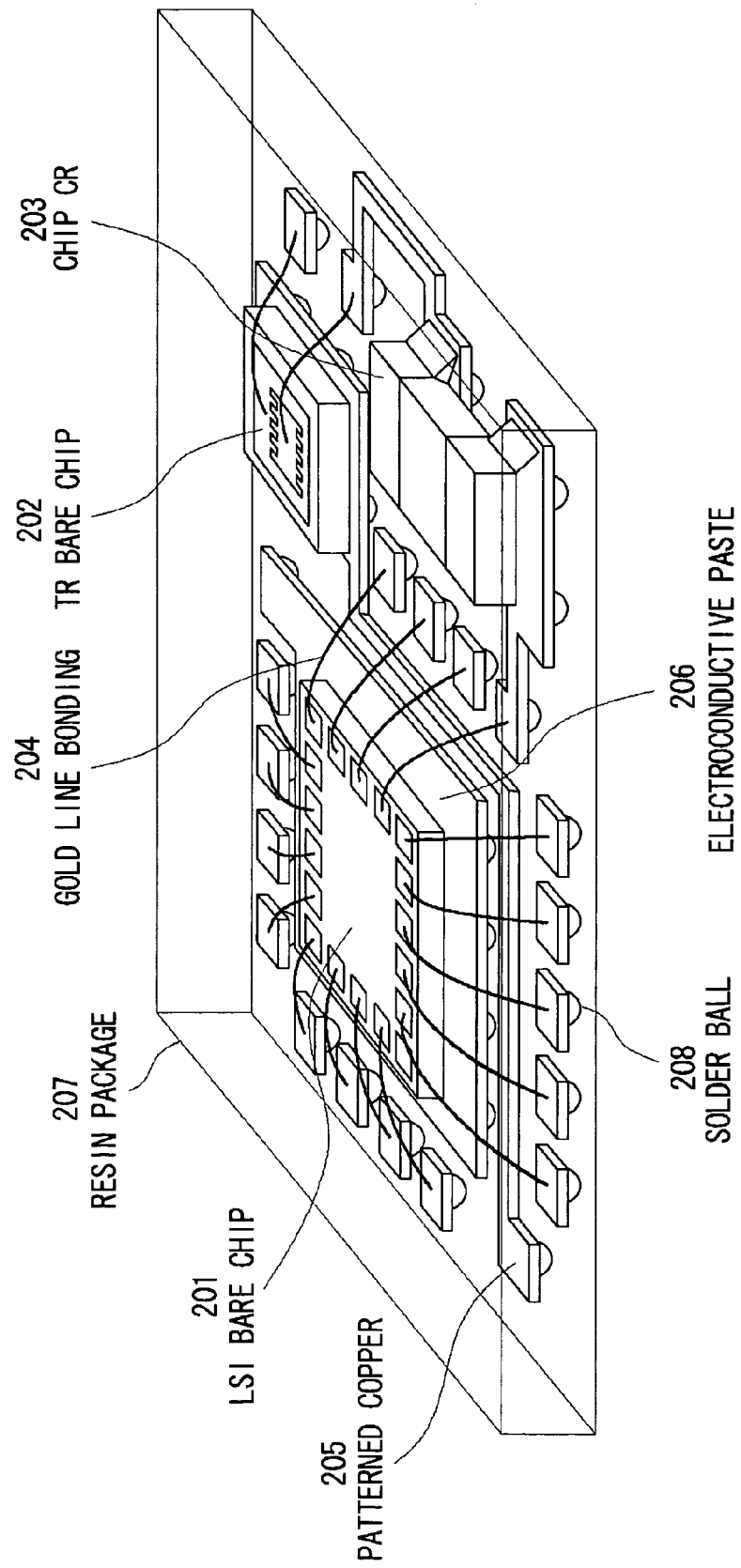
FIG. 1 is a perspective view of ISB™, indicating an example of the ISB™.
Figure 2A:
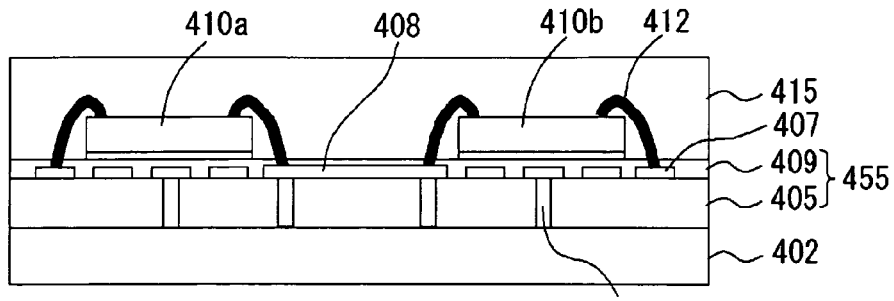
FIGS. 2A to 2E are cross sectional views of a semiconductor device of a preferred embodiment of the present invention, showing the process steps for manufacturing the semiconductor device.

FIG. 2A shows a structure of a multi-layer member in midcourse of the manufacturing of the semiconductor device. Here, the multi-layer member comprises a metal foil 402, a multi-layer interconnect line structure 455 formed thereon, a first circuit element 410a and a second circuit element 410b both formed thereon, and a packaging film 415 formed thereon so as to cover the circuit element 410a and the circuit element 410b. The multi-layer interconnect line structure 455 comprises an interlayer insulating film 405, vias 403 disposed in the interlayer insulating film 405, interconnect lines 407 and an interconnect line 408 both electrically coupled to the vias 403, and an insulating film 409 formed thereon so as to cover the interconnect lines 407 and the interconnect line 408. Although the multi-layer interconnect line structure 455 is shown as a simplified form, the multi-layer interconnect line structure 455 actually has a multi-layer structure comprising a plurality of vias, interconnect lines and insulating films.

The typical examples of the first circuit element 410a and the second circuit element 410b may be, for example, semiconductor elements such as transistors, diodes, IC chips or the like, and passive elements such as chip condensers, chip resistors or the like. The first circuit element 410a and the second circuit element 410b are electrically coupled correspondingly to the interconnect lines 407 and the interconnect line 408 via wires 412. In this stage, the interconnect line 408 is coupled commonly to the first circuit element 410a and the second circuit element 410b. The detailed structure of the multi-layer interconnect line structure 455 and the steps in the manufacturing method of the multi-layer member until this stage will be described later.

The processing steps for manufacturing the semiconductor device by dividing thus constituted multi-layer member will be described below.

Figure 2B:
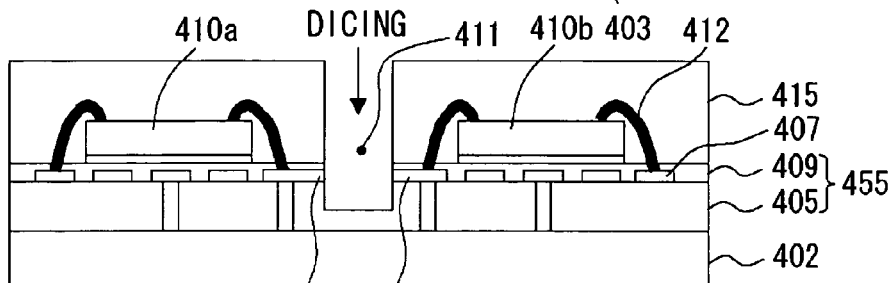

First, the multi-layer member is diced from the front surface side (upper side in the figure) to the midway within the interlayer insulating film 405 to form a dividing gutter 411 (FIG. 2B). In this process, the interconnect line 408 is divided into an interconnect line 408a coupled to the first circuit element 410a and an interconnect line 408b coupled to the second circuit element 410b, and accordingly the interconnect line 408a and the interconnect line 408b are partially exposed over the side surface of the dividing gutter 411.

Figure 2C:
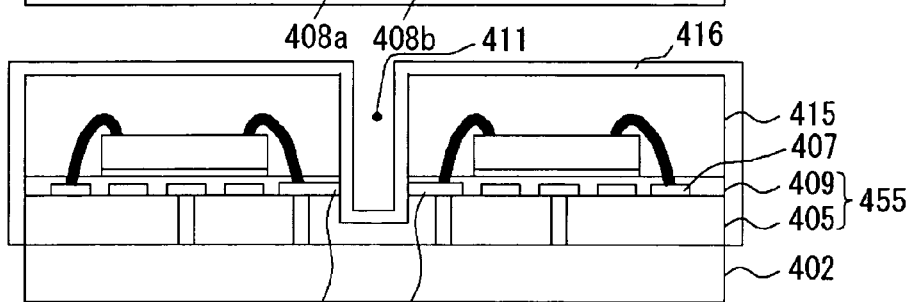

Subsequently, a shielding film 416 is formed so as to cover the surface of the multi-layer member (FIG. 2C). The shielding film 416 may be composed of the material same as the metal employed for composing the interconnect lines 407 and the interconnect line 408. The shielding film 416 may be composed of a metal having relatively lower resistivity such as copper, silver or the like. Further, the shielding film 416 may preferably be composed of a material having a linear expansion coefficient, the value of which is closer to that of other elements constituting the multi-layer member such as the packaging film 415, the interconnect lines 407, the interlayer insulating film 405, insulating film 409 or the like. The shielding film 416 may be formed by processing methods such as plating, sputtering, CVD or the like. When the shielding film 416 is formed via the plating method, electroless plating is conducted with a chemical copper species such as copper sulfate to form a thin film of copper on the surface of the multi-layer member, and thereafter, electrolytic plating is conducted. The electrolytic plating may be carried out by, for example, dipping the front surface side of the multi-layer member into aqueous solution of copper sulfate having a solution temperature of about 25 degree C. The shielding film 416 is formed so as to be electrically coupled to the interconnect line 408a and the interconnect line 408b. The shielding film 416 may be formed by covering the entire multi-layer member and thereafter patterning the backside of the multi-layer member to remove unwanted portion of the shielding film 416, or by dipping only the front surface side of the multi-layer member into a plating solution. Alternatively, the shielding film 416 may be formed by adhering an electroconductive paste via a screen printing method.

Figure 2D:
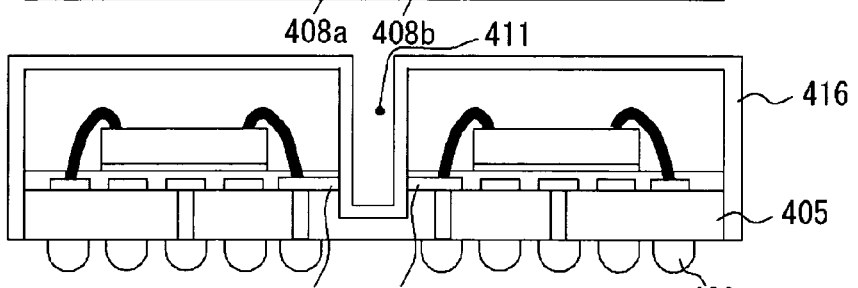

Thereafter, the metal foil 402 is removed. The removal of the metal foil 402 may be conducted via polishing, grinding, etching, laser metal evaporation or the like. Subsequently, an electroconductive material such as solder is adhered onto the exposed vias 403 to form a solder balls 420 on the backside surface of the multi-layer interconnect line structure 455 (FIG. 2D). The solder balls 420, which are respectively coupled to the interconnect line 408a and the interconnect line 408b, are grounded. This configuration also provides the grounding of the shielding film 416, thereby ensuring the function of the semiconductor device for shielding the noise.

Figure 2E:
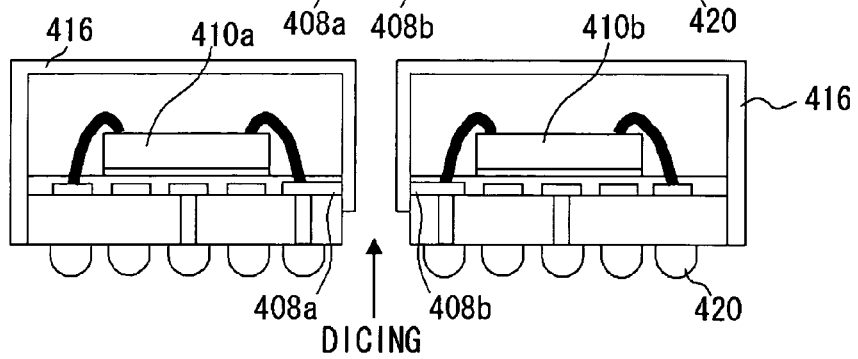

Subsequently, the multi-layer member is again diced from the backside of the multi-layer member along the dividing gutter 411 to eventually form the semiconductor devices (FIG. 2E). Here, the dicing operation from the backside is conducted so that the coupling condition of the shielding film 416 respectively to the interconnect line 408a and the interconnect line 408b is maintained in each of the semiconductor device.

In the present embodiment, the metal foil 402 functions as a support substrate until conducting the removing operation of the metal foil 402 as shown in FIG. 2D. The metal foil 402 may also be utilized for an electrode when the electrolytic plating operations for forming the vias 403, the interconnect lines 407 and the interconnect line 408 or for forming the shielding film 416 are carried out. In addition, the use of the metal foil 402 provides better workability in transferring the metal foil to a metal mold or mounting the metal foil onto the metal mold, when the packaging film 415 is molded.

As described above, the present invention provides the formation of the shielding film 416 on the surface of the multi-layer member in a simple manner in midcourse of the manufacturing process for the semiconductor device, and thus the countermeasure for the noise problem can be achieved. This provides the improvement in the productivity of the semiconductor device. Further, since the shielding film 416 is formed directly on the surface of the packaging film 415, on which the circuit elements are molded, the miniaturization and the weight reduction of the semiconductor device can be achieved.

Figure 3A:
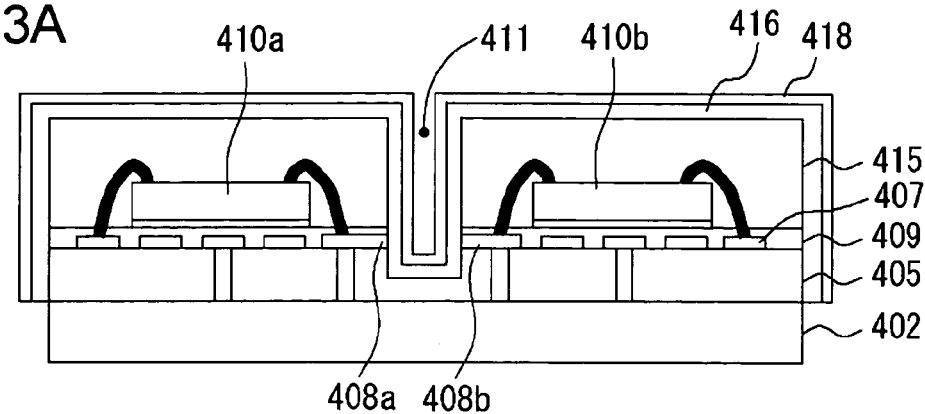
FIGS. 3A to 3C are cross sectional views of a semiconductor device, which is a modified version of the semiconductor device shown in FIG. 2E, showing the process steps for manufacturing the semiconductor device.
Figure 3B:
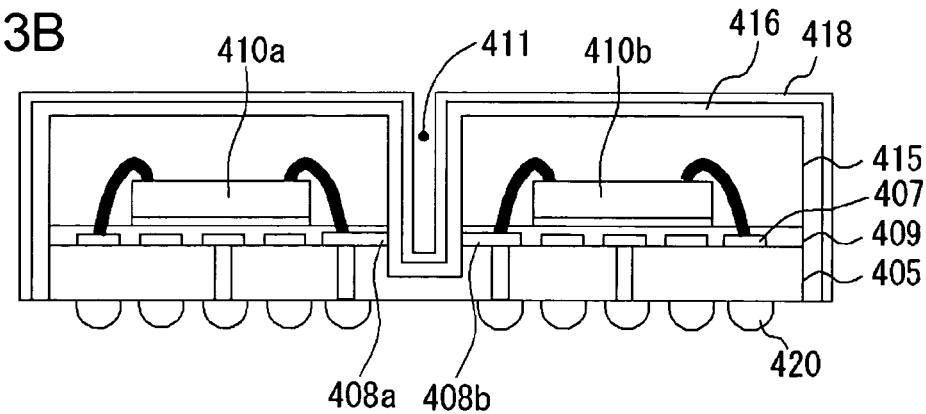
Figure 3C:
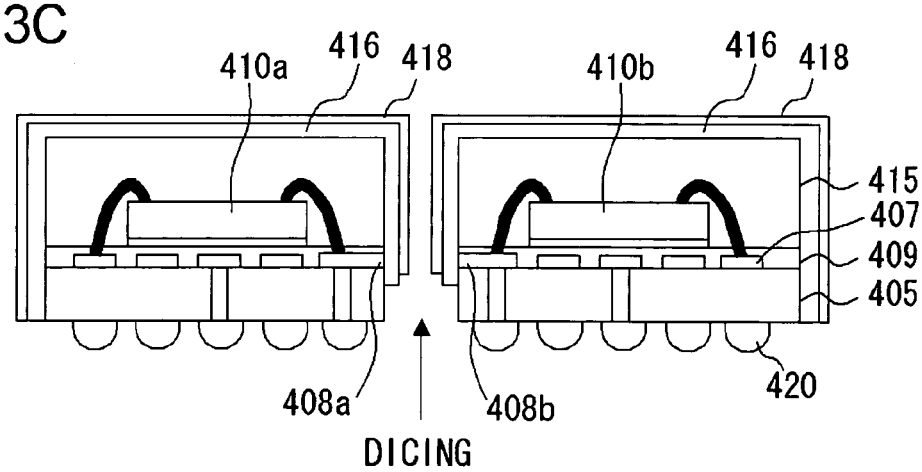

The shielding film 416 may also have a configuration of being covered with a protective film 418, as shown in FIG. 3C. Similarly as described in reference to FIG. 2C, the shielding film 416 is first formed, and thereafter the protective film 418 is formed on the shielding film 416 via, for example, plating, sputtering, CVD or the like (FIG. 3A). The protective film 418 is composed of a material having higher corrosion resistance than that of the metal used to compose the shielding film 416. The exemplary material may be, for example, nickel, gold and so on. Subsequently, the metal foil 402 is removed and the solder ball 420 is formed (FIG. 3B). Thereafter, the multi-layer member is diced from the backside thereof to eventually form the semiconductor devices (FIG. 3C).

Having this configuration, the first circuit element 410a and the second circuit element 410b of the semiconductor device can be shielded by the shielding film 416 and the surface of the shielding film 416 can be protected by the protective film 418 having higher corrosion resistance, and therefore the functions of the shielding film 416 can be maintained for longer term.

Figure 4:
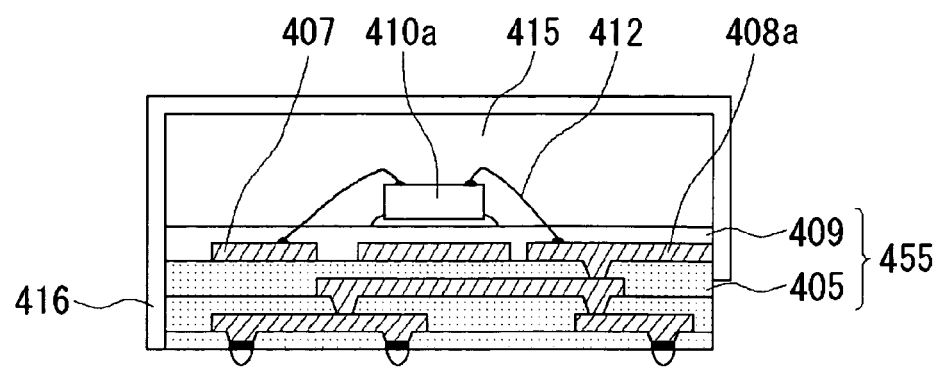
FIG. 4 is a cross sectional view of the semiconductor device shown in FIG. 2E, showing the detailed structure of the semiconductor device.

FIG. 4 is a cross sectional view of the semiconductor device, showing the details of the multi-layer interconnect line structure 455 shown in FIG. 2E. Although FIG. 2E does not show the details of the multi-layer interconnect line structure 455, the multi-layer interconnect line structure 455 is actually composed of a multi-layer interconnect line structural member having a laminated form of a plurality of interconnect line layers comprising the interlayer insulating films 405 and the interconnect lines 407.

The part of the method for manufacturing the multi-layer member by the stage shown in FIG. 2A will be described below in reference to FIGS. 5A to 5C and FIG. 2A.

Figure 5:
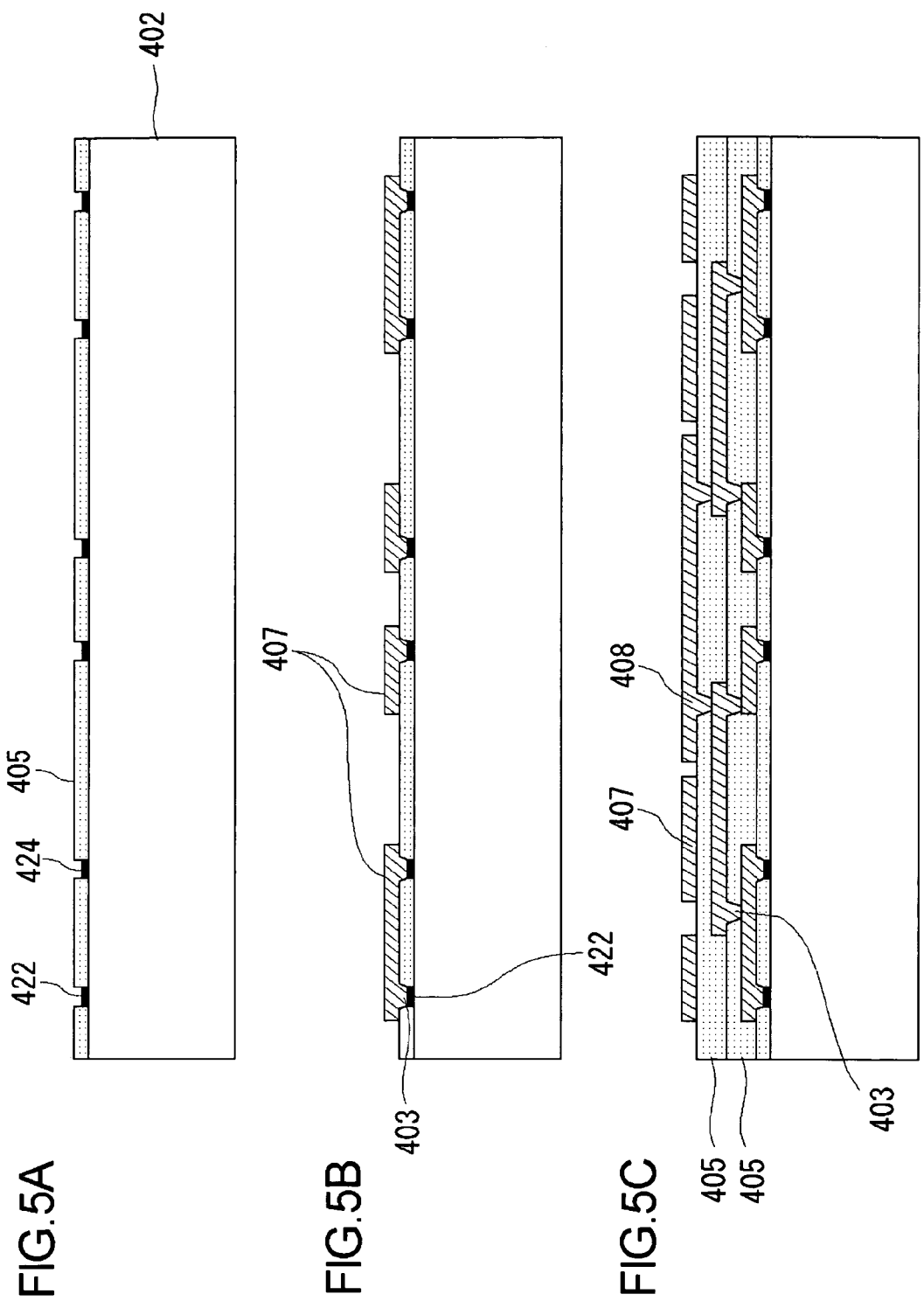
FIGS. 5A to 5C are cross sectional views of a multi-layer member included in the semiconductor device shown in FIG. 2E, showing the intermediate forms of the multi-layer member in mid course of the manufacturing of the semiconductor device.

First, an electroconductive coating films 422 are selectively formed on predetermined regions on the surface of the metal foil 402 (FIG. 5A). More specifically, the metal foil 402 is coated with a photo resist (not shown) and thereafter the photo resist on the predetermined region is removed to partially expose the surface of the metal foil 402. Subsequently, the electroconductive coating films 422 are formed on the exposed surface of the metal foil 402 via an electrolytic plating method. The film thickness of the electroconductive-coating film 422 is, for example, about 1 to 10 µm. Since the electroconductive film 422 will eventually be a rear electrode of the semiconductor device, the electroconductive film 422 may preferably be formed of gold or silver, which is a material having better adhesiveness with blazing materials such as solder or the like. The base material for the metal foil 402 may preferably be Cu, Al, or an alloy of metals such as Fe—Ni or the like. This is because these metals/alloys have better adhesiveness with blazing materials and better platability. Thickness of the metal foil 402 is not particularly limited, and may be, for example, about 10 µm to about 300 µm.

The resist utilized for forming the electroconductive coating film 422 is removed, and thereafter a first layer of a patterned interconnect line is formed on the metal foil 402. First, the metal foil 402 is chemically polished to carry out the cleaning of the surface and the roughing of the surface. Next, a thermosetting resin is deposited on the metal foil 402 to cover the entire surface of the electroconductive coating film 422, and thereafter the deposited resin is thermally cured to form the interlayer insulating film 405 having a flat surface. The exemplary material for forming the interlayer insulating film 405 may be melamine derivatives such as BT resin and so on, liquid crystal polymers, thermosetting resins such as epoxy resins, PPE resins, polyimide resins, fluorocarbon resins, phenolic resins, polyamide bismaleimide or the like. Among these, liquid crystal polymers, epoxy resins or melamine derivatives such as BT resin and so on, which have better high frequency performance, may preferably be employed. Fillers and/or additives may optionally be added with these resins.

Subsequently, via holes 424 are formed into the interlayer insulating film 405 by, for example, carbon dioxide laser processing, mechanical processing, chemical etching with chemical solutions, dry etching with plasma or the like. Thereafter, excimer laser beam is irradiated to remove the etching residues, and subsequently, a copper-plated layer is formed on the entire surface thereof so as to fill the via holes 424 therewith. The process for forming the copper-plated layer is carried out by the following process steps in order to avoid breaking the copper-plated layer at the steps of the edges of the via holes 424: first, electroless copper plating is conducted to form a thin copper layer having a thickness of about 0.5 µm on the entire surface thereof, and then the electrolytic copper plating is conducted to eventually form the copper layer having total thickness of about 20 µm. In general, palladium is often used for catalyst for the electroless copper plating, and the method for sticking the catalyst for the electroless copper plating onto a flexible insulating base is conducted by the following steps: palladium is dispersed in the water solution to form palladium complex, and the flexible base is dipped into the water solution to stick palladium complex on the surface of the flexible base, and then palladium complex is deoxidized by using a reducing agent while maintaining their position as they are to create metal palladium, and thus nucleuses for initializing the plating are formed on the surface of the flexible insulating base. Typically, an object to be plated is cleaned with alcohol or water to remove the oil content adhered onto the surface, in order to make a preparation for this operation.

Thereafter, the copper-plated layer is etched via the mask of the photo resist to form the interconnect lines 407 composed of copper (FIG. 5B). In this occasion, vias 403 are also formed. The interconnect lines 407 can be formed by the method, in which for example, a chemical etchant solution is sprayed onto the exposed portion thereof that is not covered by the resist to etch the unwanted portions of the copper foil off. Available etch resist may be etch resist materials that can be utilized for the ordinary printed board, and such resist may be formed by: conducting a silk-screen printmaking process with a resist ink; or laminating a photosensitive dry film for the etch resist on the copper foil and further applying the photo mask thereon, which is capable of transmitting lights through a shape corresponding to the shape of the electroconductive interconnect lines, and thereafter exposing thereof to ultraviolet light, and then removing the unexposed portions with a developing solution. The available chemical etchant solution may be chemical etchant solutions that can be used for the ordinary printed circuit board, such as a solution of copper chloride and hydrochloric acid, a ferric chloride solution, a solution of sulfuric acid and hydrogen peroxide, ammonium persulfate solution or the like.

Thereafter, an interlayer insulating film 405 is further formed so as to cover the interconnect lines 407 therewith, and similar procedures to the above mentioned procedures are repeated to form the multi-layer structure comprising the via holes 424, the vias 403, the interconnect lines 407 and the interconnect line 408. (FIG. 5C).

Now returning to FIG. 2A, the insulating film 409 is formed on the top of the multi-layer interconnect line structure 455. The exemplary materials for composing the insulating film 409 maybe, for example: resins such as epoxy resins, acrylic resins, urethane resins, polyimide resins or the like and mixtures thereof; or above-mentioned resins containing inorganic fillers mixed therein, the inorganic fillers including carbon black, alumina, aluminum nitride, boron nitride, tin oxide, iron oxide, copper oxide, talc, mica, kaolinite, calcium carbonate, silica, titanium oxide or the like.

Thereafter, the first circuit element 410a and the second circuit element 410b are mounted on the surface of the insulating film 409, and the first circuit element 410a and the second circuit element 410b are coupled to the interconnect lines 407 and the interconnect line 408 via wires 412. The first circuit element 410a and the second circuit element 410b are fixed to the insulating film 409 with, for example, a blazing material such as solder or the like or an adhesive agent.

Next, these first circuit element 410a and the second circuit element 410b are molded with the packaging film 415. The molding processes for the first circuit element 410a and the second circuit element 410b are simultaneously carried out by using metal molds. Although two circuit elements are shown in the drawings, the molding processes for more than two circuit elements can be simultaneously carried out. The formation of the packaging film 415 may be achieved by transfer molding, injection molding, potting process or dipping process. The available resin materials may be: thermosetting resins such as epoxy resins for transfer molding or potting process, and thermoplastics such as polyimide resins, polyphenylenesulfide or the like for injection molding.

Figure 6:
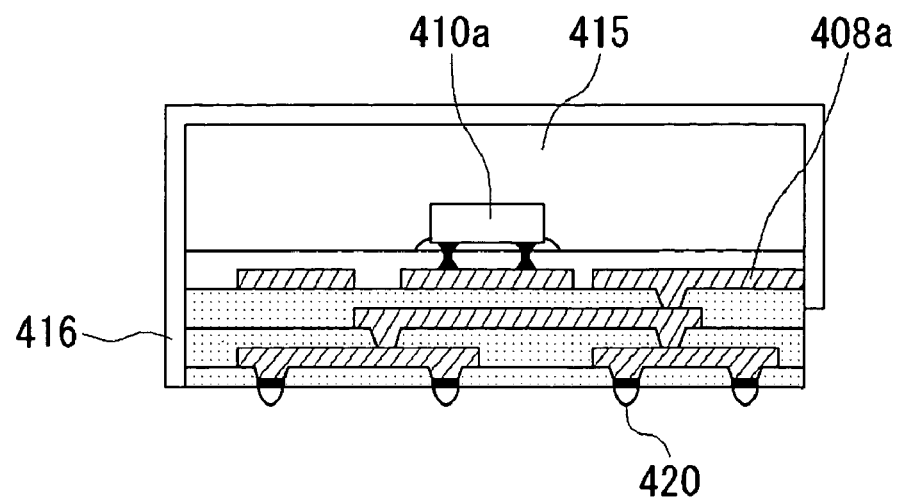
FIG. 6 is a cross sectional view of the semiconductor device on which a circuit element is mounted via flip-chip mounting in a facedown position.

In addition, although the configuration of the coupling of the circuit element 410a (and circuit element 410b) to the interconnect line 407 and the interconnect line 408a (and the interconnect line 408b) by the wire bonding method is shown in FIGS. 2A to 2E and FIGS. 5A to 5C, the flip-chip mounting may be employed to dispose the circuit element 410a thereon in a facedown position, as shown in FIG. 6.

Figure 7:
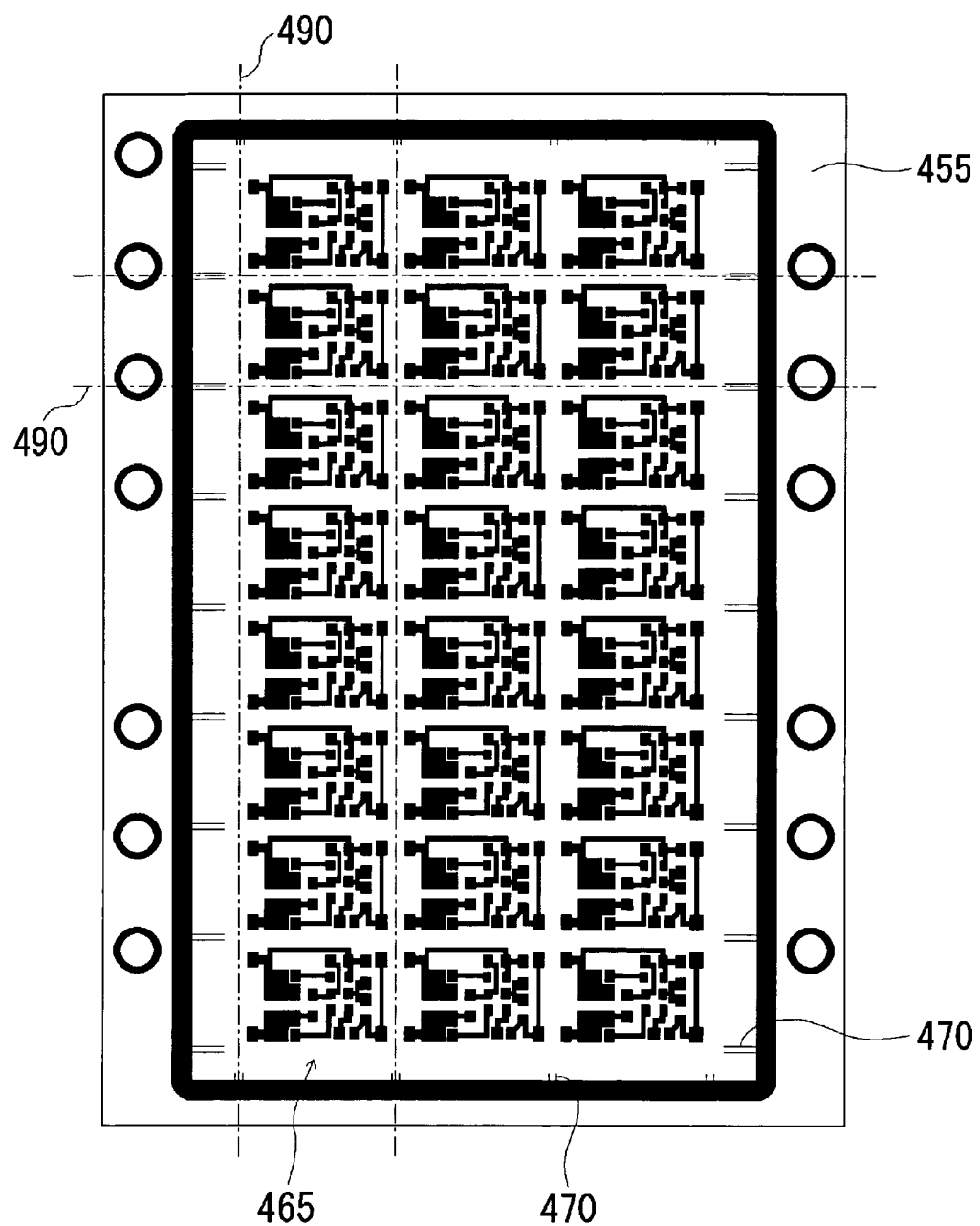
FIG. 7 is a plan view of a multi-layer interconnect line structure, on which a plurality of semiconductor devices are disposed to form a matrix arrangement.

FIG. 7 is a schematic drawing showing the status, in which a plurality of the semiconductor devices 465 formed on the multi-layer interconnect line structure 455 form a matrix arrangement. Although the packaging film 415 and the shielding film 416 are formed on a plurality of the semiconductor devices in the practical device of the present embodiment, these features are not shown in this drawing. A plurality of the semiconductor devices 465 are divided along a dicing line 490. Since the present embodiment employs the manner of dicing after removing the metal foil, the roughing of the cut surface and the wear of the blade can be inhibited. Further, aligning marks 470 are provided on the surface of the multi-layer interconnect line structure 455, so that the positions of the dicing line can be rapidly and precisely found. In the present embodiment, the aligning marks 470 are preferably formed from the front surface through the back surface of the multi-layer in structure 455 in hole shape. This provides that the positions of the dicing line can be precisely found when the dicing is conducted from the backside thereof.

In the conventional CSP such as BGA or the like, the method of punching the semiconductor device formed on the substrate out by using a metal mold is employed. Thus, it is difficult to apply the manufacturing process as described in the preferred embodiment such as forming the shielding film 416 in combination with the dicing process to the conventional CSP. Accordingly, ISB™ described in the preferred embodiment is employed to provide dividing the semiconductor device by dicing and also provide forming the shielding film 416, and therefore considerable advantages related to the manufacturing process can be obtained.

Figure 8A:
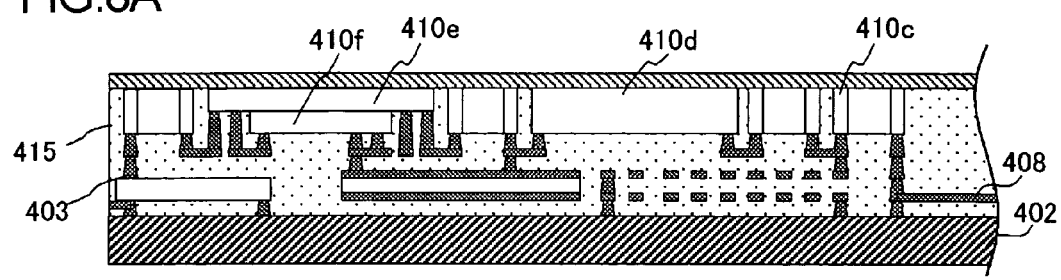
FIGS. 8A–8C are schematic diagrams showing another embodiment of a semiconductor device according to the present invention.
Figure 8B:
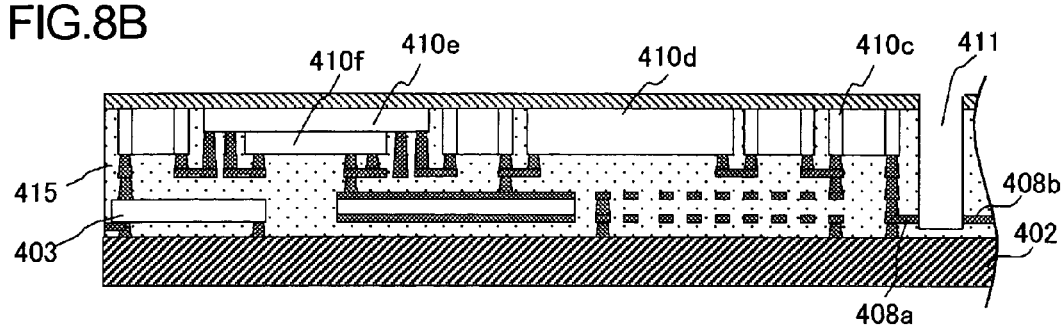
Figure 8C:
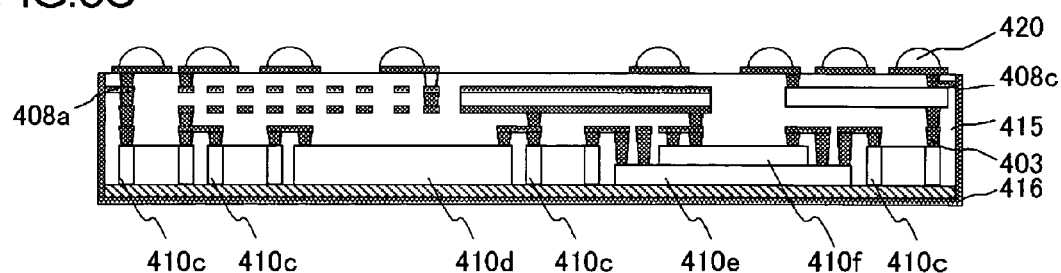

FIGS. 8A to 8C are schematic diagrams showing other embodiment of the semiconductor device according to the present invention.

Although FIGS. 2A to 2E and FIGS. 3A to 3C show configurations of having one circuit element in one semiconductor device, the semiconductor device according to the present invention may include other type of configuration of having a plurality of circuit elements in one semiconductor device.

A semiconductor device shown in FIGS. 8A to 8C include a plurality of passive elements 410c or a plurality of semiconductor elements 410d, 410e and 410f. Here, the semiconductor device includes a configuration, in which a semiconductor element 410e and another semiconductor element 410f form a laminated member. Exemplary combination of the above-mentioned semiconductor element 410e and the semiconductor element 410f may be, for example, a combination of SRAM and flash memory or a combination of SRAM and PRAM. In such cases, the semiconductor element 410e is electrically coupled to the semiconductor element 410f through a via 500.

Next, the processing steps of manufacturing process for the semiconductor device will be described.

FIG. 8A shows an intermediate form of a multi-layer member in midcourse of the manufacturing of the semiconductor device. The multi-layer member comprises a multi-layer interconnect line structure formed on a metal foil 402, a plurality of passive elements 410c and/or a plurality of semiconductor elements 410d, 410e and 410f formed thereon. Thus formed multi-layer member is diced from the upper side shown in the diagram to the midway within the multi-layer interconnect line structure to form a dividing gutter 411 (FIG. 8B). Thereafter, a shielding film is formed so as to cover the semiconductor device, similarly as described above in reference to FIG. 2C. Subsequently, the metal foil 402 is removed. Thereafter, a solder ball 420 is formed on the surface, on which the metal foil has been disposed thereon and now is removed. Subsequently, the multi-layer member is again diced along the dividing gutter. 411 from the side of the semiconductor device opposite to the side indicated in FIG. 8B to eventually form the semiconductor devices. This provides the semiconductor device having the configuration shown in FIG. 8C.

In this configuration, the shielding film 416 is electrically coupled to the solder ball 420 via the interconnect line 408c. This also provides that the solder ball 420 is grounded, and in turn, the shielding film 416 is also grounded, and thus the noise of the semiconductor device can be shielded.

As described above, the present invention can provide countermeasures for the noise problem of the semiconductor device in a simple manner. The present invention also provides the miniaturization and the weight reduction of the semiconductor device. The present invention further provides the improvement in the productivity of the semiconductor device.

What is claimed is:

1. A semiconductor device, comprising:
   an insulating layer;
   an interconnect line embedded in said insulating layer;
   a circuit element mounted on said insulating layer;
   a packaging layer formed to cover said circuit element; and
   an electroconductive shielding film formed to cover said packaging layer,
   wherein:
   said interconnect line is electrically coupled to said shielding film;
   said shielding film is in contact with said packaging layer; and
   said shielding film and said packaging layer are formed of materials having a similar coefficient of linear expansion.

2. The semiconductor device according to claim 1, further comprising a protective film formed to cover said shielding film, said protective film comprising a material having higher corrosion resistance than that of a material that is included in said shielding film.

3. The semiconductor device according to claim 1, wherein the interconnect line and the shielding film are formed of the same electro conductive material.

* * * * *